US012568761B2

(12) United States Patent
Kishizawa et al.

(10) Patent No.: US 12,568,761 B2
(45) Date of Patent: Mar. 3, 2026

(54) THERMOELECTRIC POWER GENERATION DEVICE

(71) Applicant: KELK Ltd., Kanagawa (JP)

(72) Inventors: Toshihiko Kishizawa, Kanagawa (JP); Masakazu Oba, Kanagawa (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 18/919,847

(22) Filed: Oct. 18, 2024

(65) Prior Publication Data

US 2025/0048932 A1 Feb. 6, 2025

Related U.S. Application Data

(63) Continuation of application No. 18/364,843, filed on Aug. 3, 2023, now Pat. No. 12,144,256, which is a continuation of application No. 17/557,552, filed on Dec. 21, 2021, now Pat. No. 11,765,974.

(30) Foreign Application Priority Data

Dec. 23, 2020 (JP) ................................. 2020-213112

(51) Int. Cl.
*H10N 10/17* (2023.01)
(52) U.S. Cl.
CPC .................................. *H10N 10/17* (2023.02)
(58) Field of Classification Search
CPC ..................................................... H10N 10/17
See application file for complete search history.

(56) References Cited

U.S. PATENT DOCUMENTS

| | | | |
|---|---|---|---|
| 3,208,877 A | 9/1965 | Merry | |
| 5,168,339 A | 12/1992 | Yokotani et al. | |
| 5,841,064 A | 11/1998 | Maekawa et al. | |
| | (Continued) | | |

FOREIGN PATENT DOCUMENTS

| | | |
|---|---|---|
| JP | H10-51158 A | 2/1998 |
| JP | 2002-139264 A | 5/2002 |
| | (Continued) | |

OTHER PUBLICATIONS

"Material: Polyimide," accessed from https://www.mit.edu/-6.777/ matprops/polyimide.htm, accessed on Jan. 14, 2023, 3 pages.
(Continued)

*Primary Examiner* — Golam Mowla
(74) *Attorney, Agent, or Firm* — Fish & Richardson P.C.

(57) ABSTRACT

A thermoelectric power generation device includes: a high-temperature plate having an upper face; a low-temperature plate having a lower face; a thermoelectric module disposed between the upper face and the lower face; a sealing portion disposed between the upper and lower faces, the sealing portion sealing the thermoelectric module at a circumferential portion of the upper face and a circumferential portion of the lower face; a first positioning portion disposed at the circumferential portion of the upper face; and a second positioning portion disposed at the circumferential portion of the lower face. The first positioning portion positions the sealing portion at the circumferential portion of the upper face, and the second positioning portion positions the sealing portion at the circumferential portion of the lower face.

16 Claims, 8 Drawing Sheets

(56) References Cited

U.S. PATENT DOCUMENTS

| | | | |
|---|---|---|---|
| 6,043,982 A | 3/2000 | Meissner | |
| 6,274,803 B1 * | 8/2001 | Yoshioka | H10N 10/01 |
| | | | 136/203 |
| 7,024,865 B2 | 4/2006 | Tateyama et al. | |
| 7,278,199 B2 | 10/2007 | Tateyama et al. | |
| 8,039,728 B2 * | 10/2011 | Dannoux | F01N 5/025 |
| | | | 136/238 |
| 2005/0016183 A1 | 1/2005 | Tateyama et al. | |
| 2005/0126184 A1 | 6/2005 | Cauchy | |
| 2005/0211288 A1 | 9/2005 | Tateyama et al. | |
| 2012/0247526 A1 * | 10/2012 | Okuda | H10N 10/13 |
| | | | 136/201 |
| 2014/0216516 A1 | 8/2014 | Makino et al. | |
| 2015/0116943 A1 | 4/2015 | Olsson et al. | |
| 2016/0064638 A1 | 3/2016 | Salvador et al. | |
| 2022/0199883 A1 | 6/2022 | Kishizawa et al. | |

FOREIGN PATENT DOCUMENTS

| | | | |
|---|---|---|---|
| JP | 2006-234250 A | 9/2006 | |
| JP | 2013-080883 A | 5/2013 | |
| JP | 2015-201593 A | 11/2015 | |
| WO | WO 2015/045602 A1 | 4/2015 | |

OTHER PUBLICATIONS

"Aluminum Oxide, A1203 Ceramic Properties," accessed from https://accuratus.com/alumox.html, accessed on Jan. 14, 2023, 6 pages.

"Polyimide (PI) Material Properties," accessed from https://dielectricmfg.com/knowledge-base/kapton/, accessed on Jan. 14, 2023, 1 page.

"Coefficient of Thermal Expansion," accessed from https://surfaceengineering.com/resources/coefficient-of-thermal-expansion/, accessed on Jan. 14, 2023, 6 pages.

* cited by examiner

UP

UP-AND-DOWN DIRECTION

DOWN 121a
(121)

121b
(121)

121c
(121)

121a
(121)

121b
(121)

121c
(121)

THERMOELECTRIC POWER GENERATION DEVICE

CROSS-REFERENCE TO RELATED APPLICATION(S)

The present application is a Continuation Application of U.S. patent application Ser. No. 18/364,843, filed on Aug. 3, 2023, which is a Continuation Application of U.S. patent application Ser. No. 17/557,552, filed on Dec. 21, 2021, now U.S. Pat. No. 11,765,974, which claims priority to Japanese Patent Application No. 2020-213112, filed on Dec. 23, 2020, the disclosures of which are incorporated herein by reference.

BACKGROUND OF THE INVENTION

1. Field of the Invention

The present disclosure relates to a thermoelectric power generation device.

2. Description of the Related Art

JP 2013-080883 A discloses a thermoelectric power generation device in which a first O ring surrounding the outside of thermoelectric modules is provided between a high-temperature plate and a low-temperature plate that are coupled together through first bolts at positions outside the first O ring, and each first bolt is provided with a first biasing member having elasticity and applying bias in a direction such that the high-temperature plate and the low-temperature plate remain close to each other.

For example, in a factory or ironworks, a thermoelectric power generation device is used in a high-temperature environment with condensation over a long period of time. Thus, it is desirable that such a thermoelectric power generation device has a quality of sealing resistant to long-term use in a high-temperature environment with condensation.

SUMMARY OF THE INVENTION

It is an object of the present invention to at least partially solve the problems in the conventional technology.

According to an aspect of the present invention, a thermoelectric power generation device comprises: a high-temperature plate having a first face; a low-temperature plate having a second face facing the first face; a thermoelectric module disposed between the first face and the second face; a sealing portion disposed between the first face and the second face, the sealing portion sealing the thermoelectric module at a circumferential portion of the first face and a circumferential portion of the second face; a first positioning portion disposed at the circumferential portion of the first face; and a second positioning portion disposed at the circumferential portion of the second face, wherein the first positioning portion positions the sealing portion at the circumferential portion of the first face, and the second positioning portion positions the sealing portion at the circumferential portion of the second face.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment according to the present disclosure will be described below with reference to the drawings, but the present disclosure is not limited to the embodiment. A plurality of constituent elements of embodiment described below can be appropriately combined. In some cases, some of the constituent elements are not necessarily used.

In the embodiment, the positional relationship between each part will be described with the terms "left", "right", "front", "back", "up", and "down". The terms indicate the relative position or direction based on the center of a thermoelectric power generation device 1. The left-and-right direction, the front-and-back direction, and the up-and-down direction are orthogonal to each other.

Embodiment

Thermoelectric Power Generation Device

Figure 1:
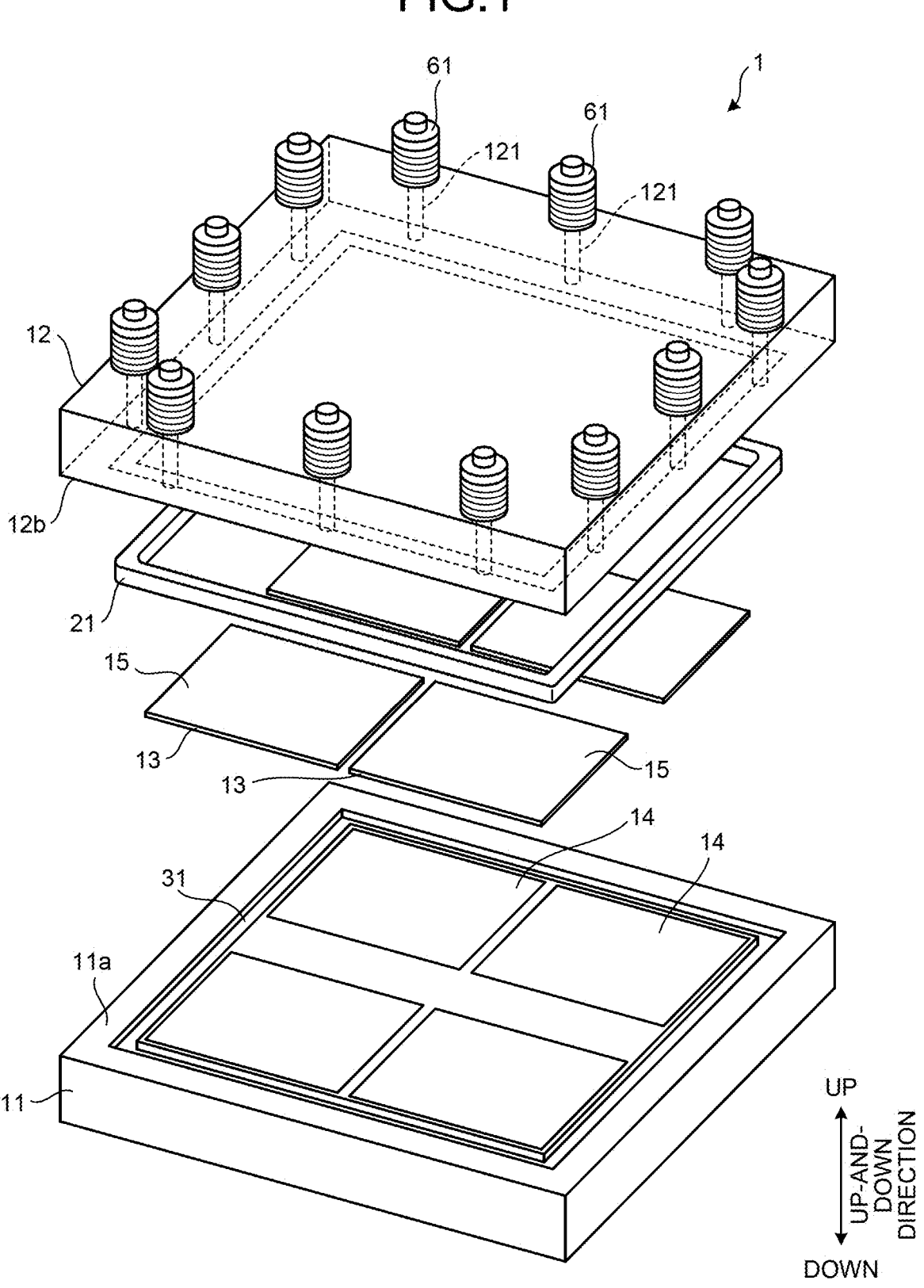
FIG. 1 is an exploded perspective view of a thermoelectric power generation device according to an embodiment.
Figure 2:
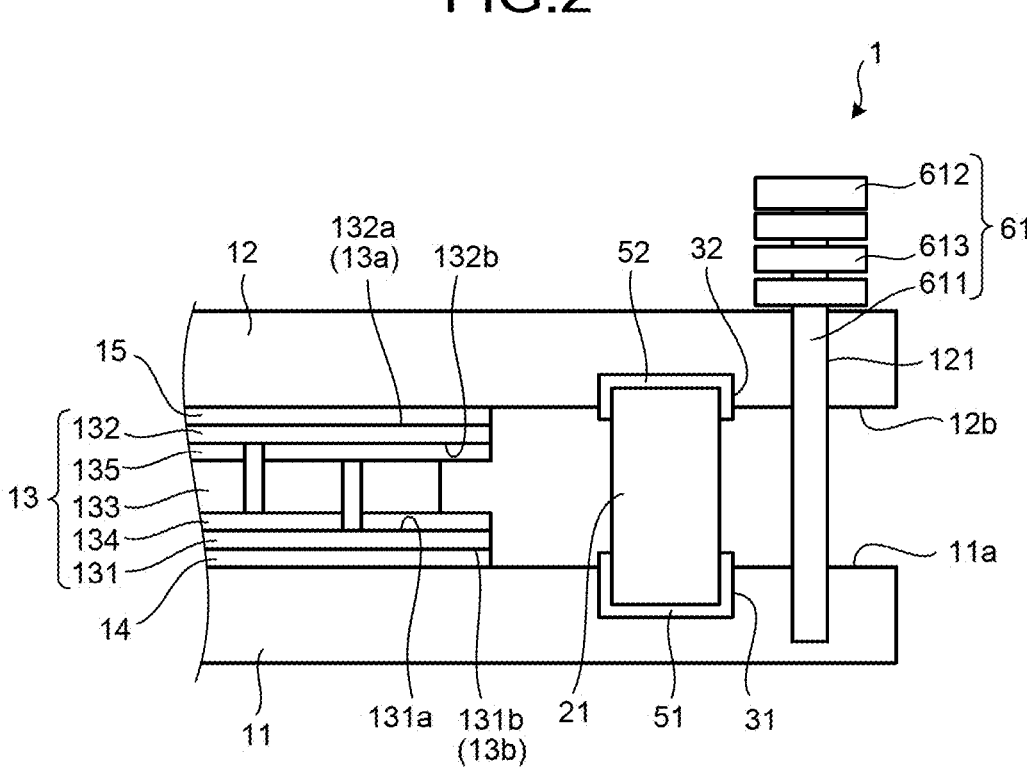
FIG. 2 is a sectional view of the thermoelectric power generation device according to the embodiment.

FIG. 1 is an exploded perspective view of a thermoelectric power generation device according to the embodiment. FIG. 2 is a sectional view of the thermoelectric power generation device according to the embodiment. For example, the thermoelectric power generation device 1 is provided at a furnace or an exhaust pipe as a source of heat in equipment, such as an incinerator or a heating furnace. For example, the thermoelectric power generation device 1 brings electric power generated due to a difference in temperature, into system interconnection.

As illustrated in FIGS. 1 and 2, the thermoelectric power generation device 1 includes a high-temperature plate 11, a low-temperature plate 12, a thermoelectric module 13, a sealing portion 21, a first positioning portion 31, and a second positioning portion 41. The thermoelectric power generation device 1 may further include a first junction 51 and a second junction 52. The thermoelectric power generation device 1 may further include a biasing member 61.

The high-temperature plate 11 is provided at equipment. The high-temperature plate 11 is a member rectangular and tabular in shape. The high-temperature plate 11 is formed of a material high in thermal conductivity. For example, the high-temperature plate 11 is formed of metal, such as steel or an aluminum alloy. The high-temperature plate 11 receives heat from the equipment. The heat of the high-temperature plate 11 is conducted to the thermoelectric module 13 through a heat-transfer member not illustrated. The high-temperature plate 11 has an upper face (first face) 11a facing upward.

In the up-and-down direction, the low-temperature plate 12 faces the high-temperature plate 11 and is spaced apart from the high-temperature plate 11. The low-temperature plate 12 is a member rectangular and tabular in shape. The low-temperature plate 12 is formed of a material high in thermal conductivity. For example, the low-temperature plate 12 is formed of metal, such as steel or an aluminum alloy. The low-temperature plate 12 receives heat from the thermoelectric module 13. The heat of the low-temperature plate 12 is dissipated around the thermoelectric power generation device 1 or is water-cooled. The low-temperature plate 12 has a lower face (second face) 12b facing downward and facing the upper face 11a of the high-temperature plate 11.

The thermoelectric module 13 is provided between the high-temperature plate 11 and the low-temperature plate 12. More particularly, the thermoelectric module 13 is provided between the upper face 11a of the high-temperature plate 11 and the lower face 12b of the low-temperature plate 12. In the embodiment, the number of thermoelectric modules 13 disposed is four. The thermoelectric module 13 generates electric power due to the Seebeck effect resulting from a difference in temperature between both sides (upper and lower sides in the figure) of the thermoelectric module 13 due to the high-temperature plate 11 and the low-temperature plate 12. The thermoelectric module 13 includes a first substrate 131, a second substrate 132, and a thermoelectric conversion element 133 disposed between the first substrate 131 and the second substrate 132.

The first substrate 131 and the second substrate 132 are each formed of an electrical insulating material. In the embodiment, the first substrate 131 and the second substrate 132 are each formed of ceramic, polyimide, or the like. In the embodiment, the first substrate 131 and the second substrate 132 are rectangular in shape.

The first substrate 131 and the second substrate 132 face apart in the up-and-down direction. In the embodiment, the second substrate 132 is disposed above the first substrate 131. The first substrate 131 has an upper face 131a and a lower face 131b. The second substrate 132 has a lower face 132b facing the upper face 131a of the first substrate 131 and an upper face 132a.

The number of thermoelectric conversion elements 133 disposed between the upper face 131a of the first substrate 131 and the lower face 132b of the second substrate 132 is one or more. A plurality of thermoelectric conversion elements 133 is connected through a first electrode 134 and a second electrode 135.

Such a thermoelectric conversion element 133 is formed of a thermoelectric material. Examples of the thermoelectric material of the thermoelectric conversion element 133 include a manganese-silicide-based compound (Mn—Si), a magnesium-silicide-based compound (Mg—Si—Sn), a skutterudite-based compound (Co—Sb), a half-Heusler-based compound (Zr—Ni—Sn), and a bismuth-telluride-based compound (Bi—Te). The thermoelectric conversion element 133 may be made of one compound selected from the manganese-silicide-based compound, the magnesium-silicide-based compound, the skutterudite-based compound, the half-Heusler-based compound, and the bismuth-telluride-based compound, or may be made of a combination of at least two compounds thereof.

The thermoelectric conversion element 133 includes a p-type element and an n-type element. The number of p-type elements and the number of n-type elements, disposed within a predetermined face, are each two or more. In the front-and-back direction, the p-type elements and the n-type elements are disposed alternately. In the left-and-right direction, the p-type elements and the n-type elements are disposed alternately.

The first electrode 134 and the second electrode 135 are each formed of metal. Examples of the metal forming each of the first electrode 134 and the second electrode 135 include copper (Cu), an alloy containing copper, nickel (Ni), an alloy containing nickel, aluminum (Al), and an alloy containing aluminum. The structure of each of the first electrode 134 and the second electrode 135 may be a double-layer structure having a combination of two of Cu, Al, and Ni or may be a triple-layer structure having a combination of all thereof. The surface of each of the first electrode 134 and the second electrode 135 may be covered with a nickel film.

The first electrode 134 is provided on the upper face 131a of the first substrate 131. The number of first electrodes 134 provided within a predetermined face parallel to the upper face 131a of the first substrate 131 is two or more. The second electrode 135 is provided on the lower face 132b of the second substrate 132. The number of second electrodes 135 provided within a predetermined face parallel to the lower face 132b of the second substrate 132 is two or more. The first electrodes 134 and the second electrodes 135 are each connected to a pair of a p-type element and an n-type element adjacent to each other.

The first electrodes 134 and the second electrodes 135 connect the plurality of thermoelectric conversion elements 133 in series. Formed is a series circuit including the plurality of thermoelectric conversion elements 133 connected in series through the first electrodes 134 and the second electrodes 135. Electrical connection of a p-type element and an n-type element through a first electrode 134 and a second electrode 135 results in achievement of a pn-paired element. Series connection of a plurality of pn-paired elements through the first electrodes 134 and the second electrodes 135 results in achievement of a series circuit including the plurality of thermoelectric conversion elements 133.

Current supply to the thermoelectric conversion elements 133 causes the thermoelectric module 13 to absorb heat or emit heat due to the Peltier effect. The thermoelectric module 13 generates electric power due to the Seebeck effect resulting from a difference in temperature between the first substrate 131 and the second substrate 132.

The lower face 131b of the first substrate 131 on which the first electrodes 134 are disposed serves as the cooling face of the thermoelectric module 13. The upper face 132a of the second substrate 132 on which the second electrodes 135 are disposed serves as the heating face of the thermoelectric module 13.

A carbon sheet 14 is a material having thermal conductivity. The carbon sheet 14 is interposed between the upper face 11*a* of the high-temperature plate 11 and a lower face 13*b* of the thermoelectric module 13. In the embodiment, the carbon sheet 14 is in contact with part of the upper face 11*a* of the high-temperature plate 11. The carbon sheet 14 transfers the heat of the high-temperature plate 11 to the lower face 13*b* of the thermoelectric module 13. In the embodiment, the carbon sheet 14 is rectangular in shape.

A carbon sheet 15 is a material having thermal conductivity. The carbon sheet 15 is interposed between the lower face 12*b* of the low-temperature plate 12 and an upper face 13*a* of the thermoelectric module 13. In the embodiment, the carbon sheet 15 is in contact with the entirety of the lower face 12*b* of the low-temperature plate 12. The carbon sheet 15 transfers the heat of the thermoelectric module 13 to the low-temperature plate 12. In the embodiment, the carbon sheet 15 is rectangular in shape.

The sealing portion 21 has a rectangular-frame shape. When viewed in the up-and-down direction, the sealing portion 21 is disposed at a circumferential portion between the high-temperature plate 11 and the low-temperature plate 12. The sealing portion 21 is disposed between the upper face 11*a* of the high-temperature plate 11 and the lower face 12*b* of the low-temperature plate 12, sealing the thermoelectric module 13 at the circumferential portion of the upper face 11*a* of the high-temperature plate 11 and the circumferential portion of the lower face 12*b* of the low-temperature plate 12.

The sealing portion 21 is fixed to the high-temperature plate 11 through the first positioning portion 31. The sealing portion 21 is fixed to the low-temperature plate 12 through the second positioning portion 41.

The material of the sealing portion 21 is lower in thermal conductivity than those of the high-temperature plate 11 and the low-temperature plate 12. Furthermore, the material of the sealing portion 21 is lower in thermal conductivity than that of the thermoelectric module 13. Thus, a leak of heat through the sealing portion 21 is inhibited.

The material of the sealing portion 21 is larger in thermal expansivity than those of the first positioning portion 31 and a second positioning portion 32. The material of the sealing portion 21 is larger in thermal expansivity than those of the high-temperature plate 11 and the low-temperature plate 12. The sealing portion 21 deforms in accordance with a variation in temperature. The sealing portion 21 deforms following a gap that occurs between the sealing portion 21 and the first positioning portion 31 or the second positioning portion 32 due to a variation in temperature.

The material of the sealing portion 21 has thermal resistance. More particularly, the material of the sealing portion 21 is resistant to long-term use in an environment at a temperature of approximately 250° C. with condensation. Examples of the material of the sealing portion 21 include engineering plastics, carbon fiber reinforced carbon composites, ceramic, quartz glass, and metal. Examples of the engineering plastics includes poly ether ether ketone (PEEK), polyimide (PI), and poly tetra fluoro ethylene (PTFE). Examples of the ceramic include zirconia, alumina, silicon nitride, and silicon carbide. Examples of the metal include titanium, a titanium alloy, Inconel, Hastelloy, Nimonic, and zirconium.

Figure 3:
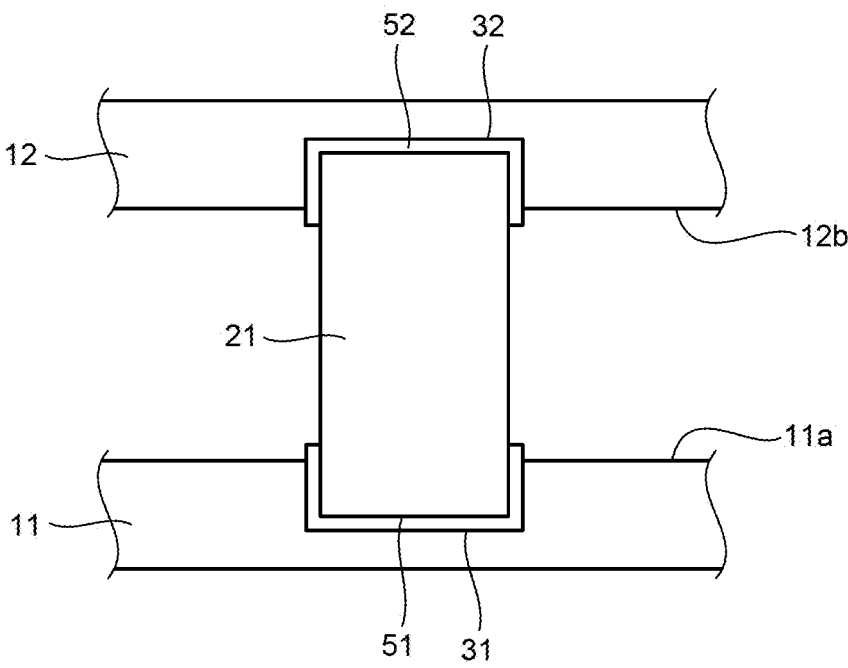
FIG. 3 is a sectional view of an exemplary sealing portion and exemplary positioning portions.

FIG. 3 is a sectional view of an exemplary sealing portion and exemplary positioning portions. The first positioning portion 31 is disposed at the circumferential portion of the upper face 11*a* of the high-temperature plate 11. The first positioning portion 31 positions the sealing portion 21 at the circumferential portion of the upper face 11*a*. The first positioning portion 31 is disposed along the circumferential portion of the upper face 11*a*. The first positioning portion 31 is at least either recessed to or protruding from the upper face 11*a*. In the embodiment, as illustrated in FIG. 3, the first positioning portion 31 is recessed to the upper face 11*a*. In other words, the first positioning portion 31 is provided as a groove. The first positioning portion 31 engages with the lower portion of the sealing portion 21. In the embodiment, when viewed in the up-and-down direction, the first positioning portion 31 has a rectangular-frame shape.

The second positioning portion 32 is disposed at the circumferential portion of the lower face 12*b* of the low-temperature plate 12. The second positioning portion 32 positions the sealing portion 21 at the circumferential portion of the lower face 12*b*. The second positioning portion 32 is disposed along the circumferential portion of the upper face 11*a*. The second positioning portion 32 is disposed facing the first positioning portion 31. The second positioning portion 32 is at least either recessed to or protruding from the lower face 12*b*. In the embodiment, as illustrated in FIG. 3, the second positioning portion 32 is recessed to the lower face 12*b*. In other words, the second positioning portion 32 is provided as a groove. The second positioning portion 32 engages with the upper portion of the sealing portion 21. In the embodiment, when viewed in the up-and-down direction, the second positioning portion 32 has a rectangular-frame shape.

Other examples of the first positioning portion 31 and the second positioning portion 32 will be described with FIGS. 4 to 8.

Figure 4:
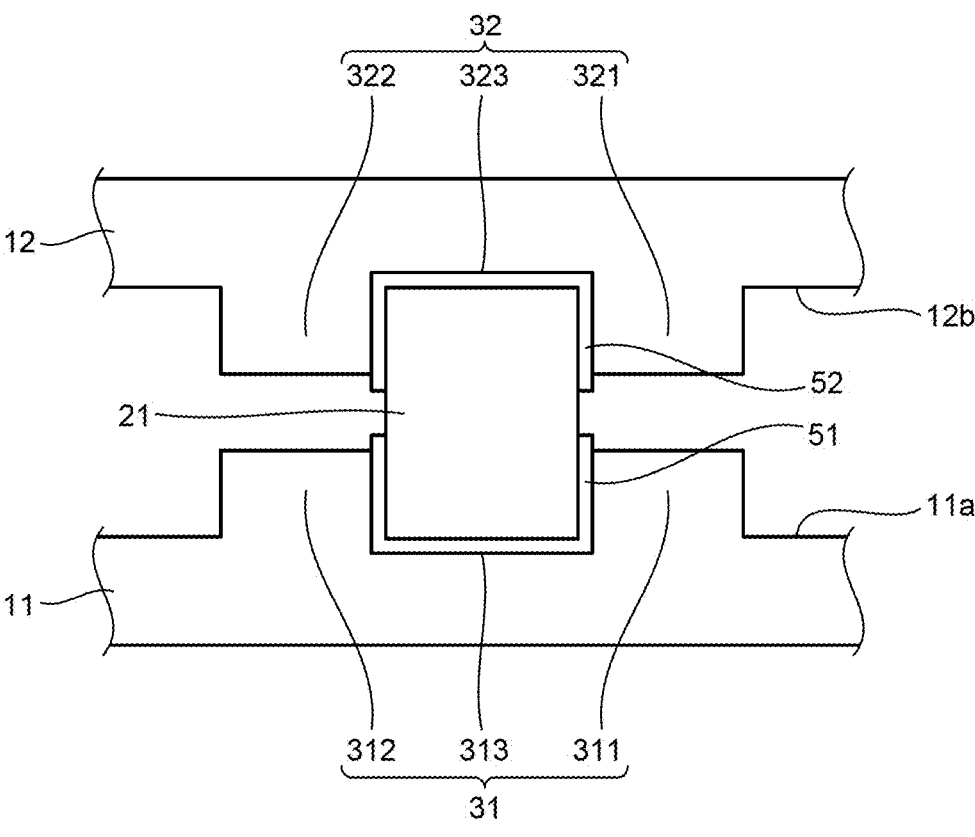
FIG. 4 is a sectional view of an exemplary sealing portion and exemplary positioning portions.

FIG. 4 is a sectional view of an exemplary sealing portion and exemplary positioning portions. The first positioning portion 31 illustrated in FIG. 4 is protruding from the upper face 11*a*. In other words, the first positioning portion 31 is provided as a projection. The first positioning portion 31 has a protruding portion 311 and a protruding portion 312 that are protruding from the upper face 11*a*. The protruding portion 311 and the protruding portion 312 are spaced apart. A recessed portion 313 formed between the protruding portion 311 and the protruding portion 312 engages with the lower portion of the sealing portion 21. The second positioning portion 32 is similar in formation to the first positioning portion 31. The protruding portion 311 and a protruding portion 321 are disposed facing mutually. The protruding portion 312 and a protruding portion 322 are disposed facing mutually. The recessed portion 313 and a recessed portion 323 are disposed facing mutually. The recessed portion 323 formed between the protruding portion 321 and the protruding portion 322 engages with the upper portion of the sealing portion 21.

Figure 5:
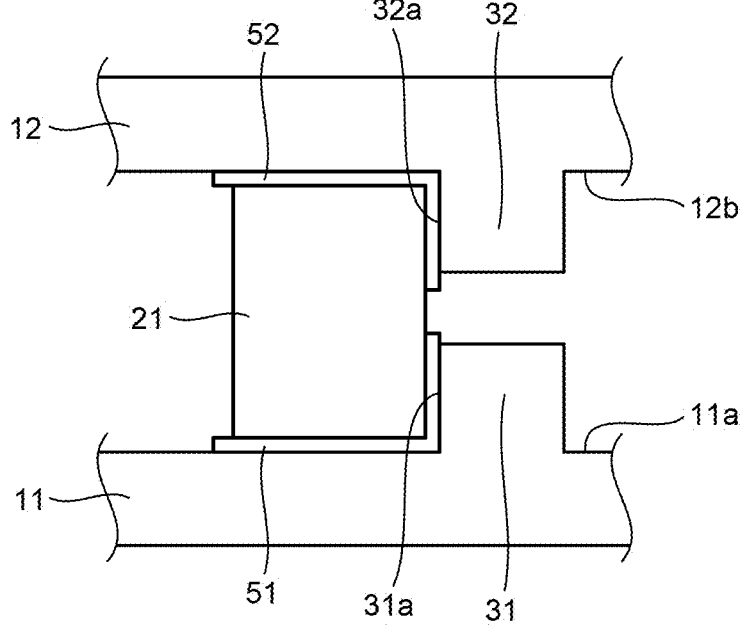
FIG. 5 is a sectional view of an exemplary sealing portion and exemplary positioning portions.

FIG. 5 is a sectional view of an exemplary sealing portion and exemplary positioning portions. The first positioning portion 31 illustrated in FIG. 5 is protruding from the upper face 11*a*. In other words, the first positioning portion 31 is provided as a projection. The sealing portion 21 is disposed inside the first positioning portion 31. The sealing portion 21 is positioned with the first positioning portion 31 having a face 31*a* in contact with the lower portion of the sealing portion 21. The second positioning portion 32 is similar in formation to the first positioning portion 31. The sealing portion 21 is positioned with the second positioning portion 32 having a face 32*a* in contact with the upper portion of the sealing portion 21.

Figure 6:
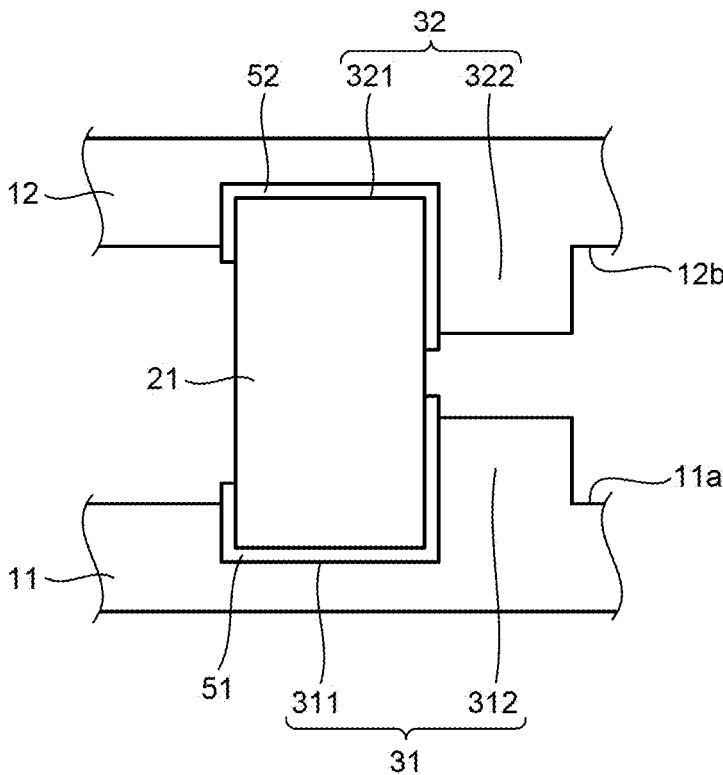
FIG. 6 is a sectional view of an exemplary sealing portion and exemplary positioning portions.

FIG. 6 is a sectional view of an exemplary sealing portion and exemplary positioning portions. The first positioning portion 31 illustrated in FIG. 6 has a recessed portion 311 recessed to the upper face 11a and a protruding portion 312 protruding from the upper face 11a. The protruding portion 312 is disposed closer to the outer circumference than the recessed portion 311 is. The recessed portion 311 engages with the lower portion of the sealing portion 21. The second positioning portion 32 is similar in formation to the first positioning portion 31. The recessed portion 311 and a recessed portion 321 are disposed facing mutually. The protruding portion 312 and a protruding portion 322 are disposed facing mutually. The recessed portion 321 engages with the upper portion of the sealing portion 21.

Figure 7:
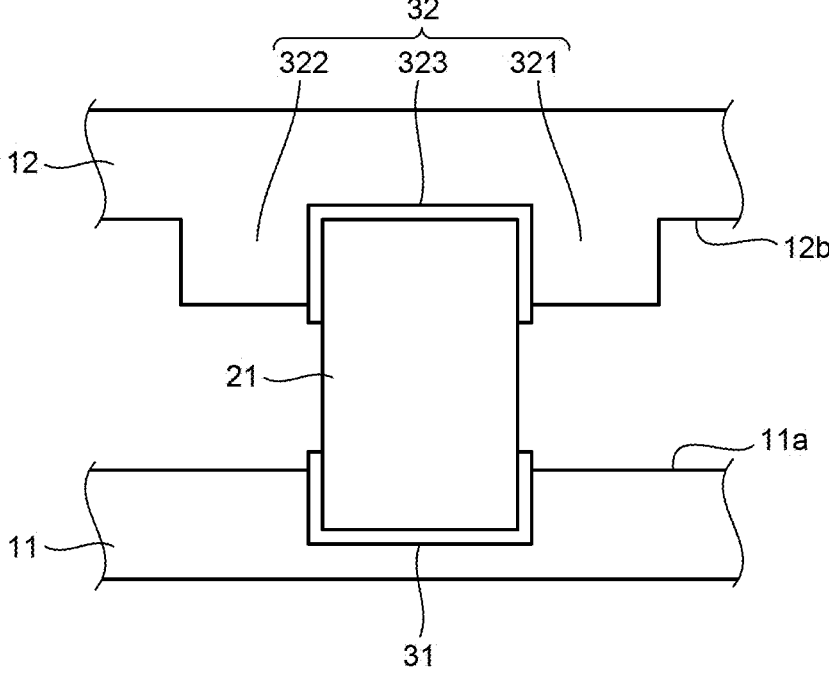
FIG. 7 is a sectional view of an exemplary sealing portion and exemplary positioning portions.

FIG. 7 is a sectional view of an exemplary sealing portion and exemplary positioning portions. The first positioning portion 31 illustrated in FIG. 7 is similar in configuration to the first positioning portion 31 illustrated in FIG. 3. The second positioning portion 32 illustrated in FIG. 7 is similar in configuration to the second positioning portion 32 illustrated in FIG. 4.

Figure 8:
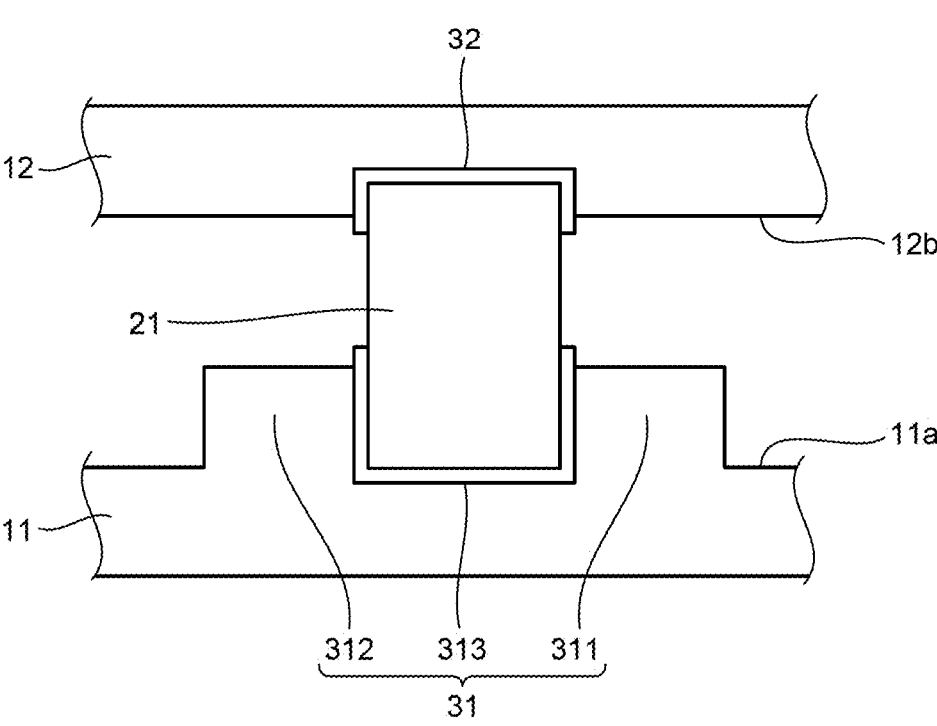
FIG. 8 is a sectional view of an exemplary sealing portion and exemplary positioning portions.

FIG. 8 is a sectional view of an exemplary sealing portion and exemplary positioning portions. The first positioning portion 31 illustrated in FIG. 8 is similar in configuration to the first positioning portion 31 illustrated in FIG. 4. The second positioning portion 32 in FIG. 8 is similar in configuration to the second positioning portion 32 illustrated in FIG. 3.

The sealing portion 21 may be fixed between the high-temperature plate 11 and the low-temperature plate 12 through the first junction 51 and the second junction 52.

The first junction 51 is interposed between the lower portion of the sealing portion 21 and the first positioning portion 31 on the upper face 11a of the high-temperature plate 11. The first junction 51 deforms in accordance with a variation in temperature. The first junction 51 deforms following a gap that occurs between the lower portion of the sealing portion 21 and the first positioning portion 31 on the upper face 11a of the high-temperature plate 11 due to a variation in temperature. The material of the first junction 51 is larger in thermal expansivity than that of the sealing portion 21. For example, the first junction 51 is formed of an elastic material having elasticity, such as a liquid gasket. Preferably, the upper end of the first junction 51 is higher in level than the upper end of the first positioning portion 31.

The second junction 52 is interposed between the upper portion of the sealing portion 21 and the second positioning portion 32 on the lower face 12b of the low-temperature plate 12. The second junction 52 deforms in accordance with a variation in temperature. The second junction 52 deforms following a gap that occurs between the upper portion of the sealing portion 21 and the second positioning portion 32 on the lower face 12b of the low-temperature plate 12 due to a variation in temperature. The material of the second junction 52 is larger in thermal expansivity than that of the sealing portion 21. For example, the second junction 52 is formed of an elastic material having elasticity, such as a liquid gasket. Preferably, the lower end of the second junction 52 is lower in level than the lower end of the second positioning portion 32.

The biasing member 61 is disposed biasing the high-temperature plate 11 and the low-temperature plate 12. The high-temperature plate 11 and the low-temperature plate 12 are provided with the biasing member 61 avoiding the area in which each thermoelectric module 13 is disposed. A plurality of biasing members 61 is disposed outside the first positioning portion 31 on the high-temperature plate 11 and outside the second positioning portion 32 on the low-temperature plate 12. The plurality of biasing members 61 is disposed ununiformly in distance from the circumferential portion of the high-temperature plate 11 and in distance from the circumferential portion of the low-temperature plate 12. Each biasing member 61 includes a shaft 611, a head 612, and a coil spring 613. The shaft 611 is inserted through a hole 121. The head 612 is disposed at one end in the axial direction of the shaft 611. The diameter of the head 612 is larger than the diameter of the shaft 611. The coil spring 613 having the shaft 611 inserted therethrough is disposed below the head 612 and above the low-temperature plate 12. The coil spring 613 applies bias in a direction such that the space between the high-temperature plate 11 and the low-temperature plate 12 remains narrow.

Figure 9:
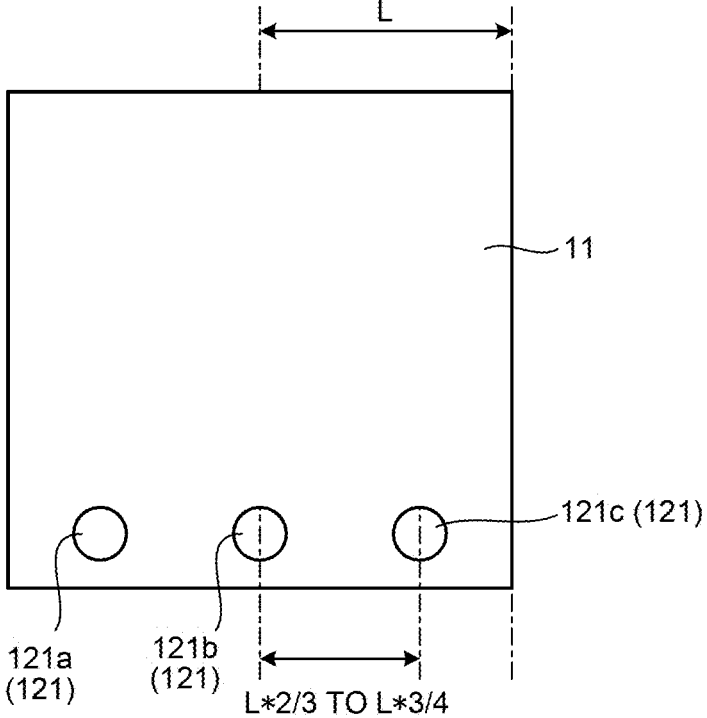
FIG. 9 is a schematic view of exemplary arrangement of holes each for insertion of a biasing member.

FIG. 9 is a schematic view of exemplary arrangement of holes each for insertion of a biasing member. The high-temperature plate 11 and the low-temperature plate 12 similarly have holes each for insertion of a biasing member. Herein, the arrangement of holes 121 formed at the high-temperature plate 11 will be described, but description of holes formed at the low-temperature plate 12 will be omitted. In FIG. 9, for simplification of description, holes 121 disposed at one side of the high-temperature plate 11 are illustrated, but illustration of holes 121 disposed at the other sides is omitted. The same applies to the following description. The high-temperature plate 11 and the low-temperature plate 12 are provided with a hole for insertion of a biasing member 61, avoiding the area in which each thermoelectric module 13 is disposed. The hole for insertion of a biasing member 61 is disposed outside the first positioning portion 31 on the high-temperature plate 11 and outside the second positioning portion 32 on the low-temperature plate 12. In the embodiment, the hole 121 for insertion of a biasing member 61 is disposed at the circumferential portion of the high-temperature plate 11. A plurality of holes 121 is disposed. In the embodiment, for example, three holes 121a, 121b, and 121c are disposed at each side of the high-temperature plate 11. The number of holes 121 is not limited to this. In a case where the holes 121a, 121b, and 121c do not particularly require distinguishing, these holes will be each given as a hole 121. When viewed in the up-and-down direction, the holes 121 are disposed outside the first positioning portion 31 disposed on the upper face 11a of the high-temperature plate 11. The holes 121 are disposed ununiformly in distance from the circumferential portion of the high-temperature plate 11 and in distance from the circumferential portion of the low-temperature plate 12. Preferably, the holes 121 are ununiform in distance from the circumferential portion. Preferably, the holes 121 disposed at each side are not linearly disposed. In the example illustrated in FIG. 9, when the length from the center to an end of one side of the high-temperature plate 11 is defined as L, the space between adjacent holes 121 is approximately ⅔ L to ¾ L.

Even in a case where the high-temperature plate 11 or the low-temperature plate 12 deforms thermally due to a load in temperature or deforms due to creep, the deformation is suppressed by the biasing force of each biasing member 61.

Figure 10:
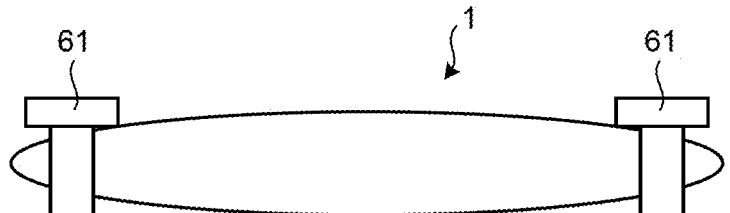
FIG. 10 is an explanatory schematic view of exemplary deformation in the thickness direction of the thermoelectric power generation device due to biasing members.
Figure 11:
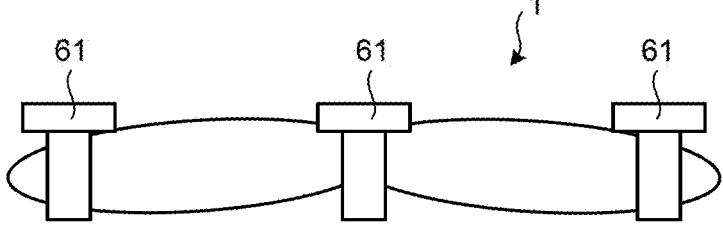
FIG. 11 is an explanatory schematic view of other exemplary deformation in the thickness direction of the thermoelectric power generation device due to biasing members.

FIGS. 10 and 11 each schematically illustrate a side face of the thermoelectric power generation device 1. FIG. 10 is an explanatory schematic view of exemplary deformation in the thickness direction of the thermoelectric power generation device due to biasing members. FIG. 11 is an explanatory schematic view of other exemplary deformation in the thickness direction of the thermoelectric power generation device due to biasing members. For simplification of description, FIGS. 10 and 11 each schematically illustrates the configuration of the thermoelectric power generation device 1. As illustrated in FIG. 10, in a case where the corners of each of the high-temperature plate 11 and the low-temperature plate 12 are fixed with biasing members 61, the central portion of each of the high-temperature plate 11 and the low-temperature plate 12 expands. The thickness of the central portion of each of the high-temperature plate 11 and the low-temperature plate 12 is thicker than the thickness of each end thereof. Thus, the thickness of the thermoelectric power generation device 1 is ununiform. As illustrated in FIG. 11, in a case where the corners of each of the high-temperature plate 11 and the low-temperature plate 12 are fixed with biasing members 61 and additionally the intermediate portion of each side is fixed with a biasing member 61, the intermediate portion of each side of the high-temperature plate 11 and the low-temperature plate 12 is inhibited from expanding, in comparison to FIG. 10. Thus, inhibited are variations in the thickness of the thermoelectric power generation device 1. Therefore, desirably, holes each for insertion of a biasing member 61 are disposed not only at the corners of each of the high-temperature plate 11 and the low-temperature plate 12 but also at the intermediate portion of each side.

Figure 12:
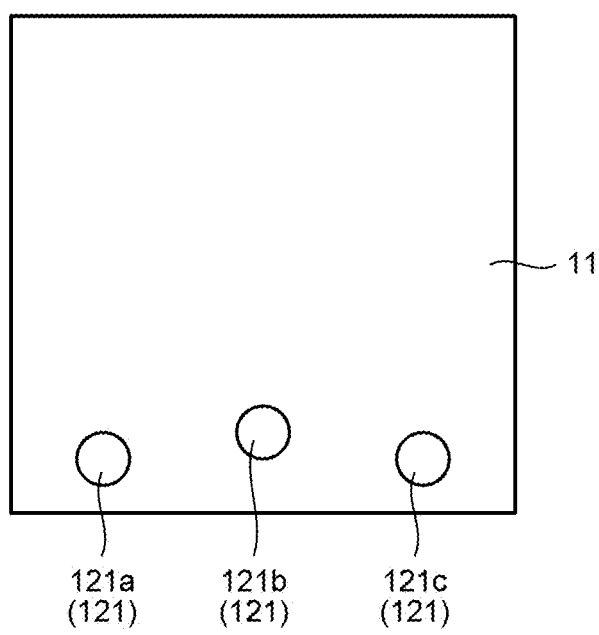
FIG. 12 is a schematic view of exemplary arrangement of holes each for insertion of a biasing member.

Other examples of arrangement of holes 121 will be described with FIGS. 12 to 15. FIG. 12 is a schematic view of exemplary arrangement of holes each for insertion of a biasing member. The hole 121*a* and the hole 121*c* illustrated in FIG. 12 are disposed at positions identical to those of the hole 121*a* and the hole 121*c* illustrated in FIG. 9. The hole 121*b* is spaced further apart from the circumferential portion of the high-temperature plate 11 than the hole 121*a* and the hole 121*c* are. In other words, the hole 121*b* is disposed inner than the hole 121*a* and the hole 121*c*. The hole 121*a*, the hole 121*b*, and the hole 121*c* are not disposed linearly.

Figure 13:
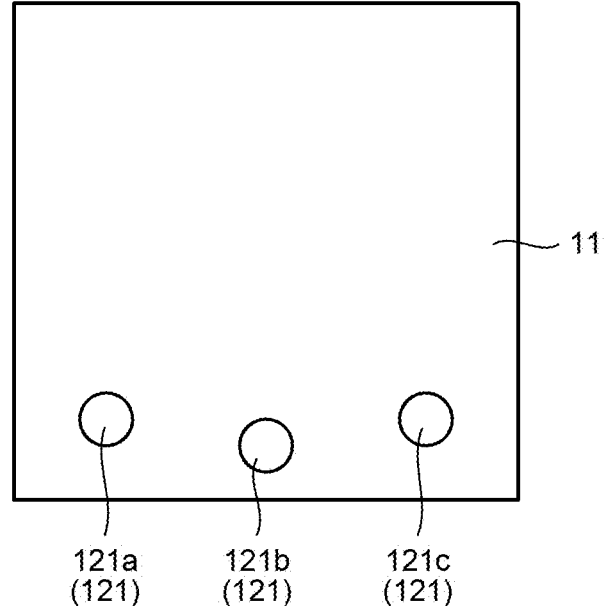
FIG. 13 is a schematic view of exemplary arrangement of holes each for insertion of a biasing member.

FIG. 13 is a schematic view of exemplary arrangement of holes each for insertion of a biasing member. The hole 121*b* illustrated in FIG. 13 is disposed at a position identical to that of the hole 121*b* illustrated in FIG. 9. The hole 121*a* and the hole 121*c* are spaced further apart from the circumferential portion of the high-temperature plate 11 than the hole 121*b* is. In other words, the hole 121*a* and the hole 121*c* are disposed inner than the hole 121*b*. The hole 121*a*, the hole 121*b*, and the hole 121*c* are not disposed linearly.

Figure 14:
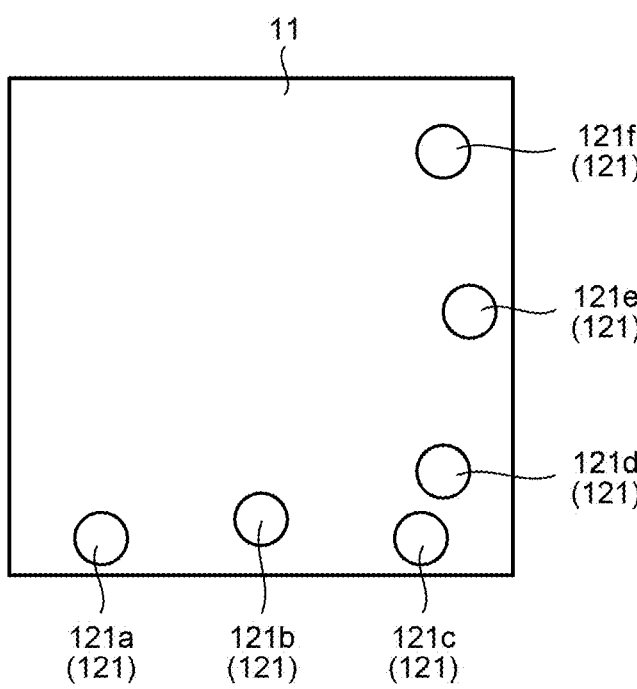
FIG. 14 is a schematic view of exemplary arrangement of holes each for insertion of a biasing member.

FIG. 14 is a schematic view of exemplary arrangement of holes each for insertion of a biasing member. In FIG. 14, for simplification of description, holes 121 disposed at two sides of the high-temperature plate 11 are illustrated, but illustration of holes 121 disposed at the other two sides is omitted. The same applies to FIG. 15. The hole 121*a*, the hole 121*b*, and the hole 121*c* illustrated in FIG. 14 are disposed at positions identical to those of the hole 121*a*, the hole 121*b*, and the hole 121*c* illustrated in FIG. 12. The hole 121*d*, the hole 121*e*, and the hole 121*f* illustrated in FIG. 14 are disposed at the positions of the hole 121*a*, the hole 121*b*, and the hole 121*c* illustrated in FIG. 13 rotated counterclockwise by 90° around the central point of the high-temperature plate 11.

Figure 15:
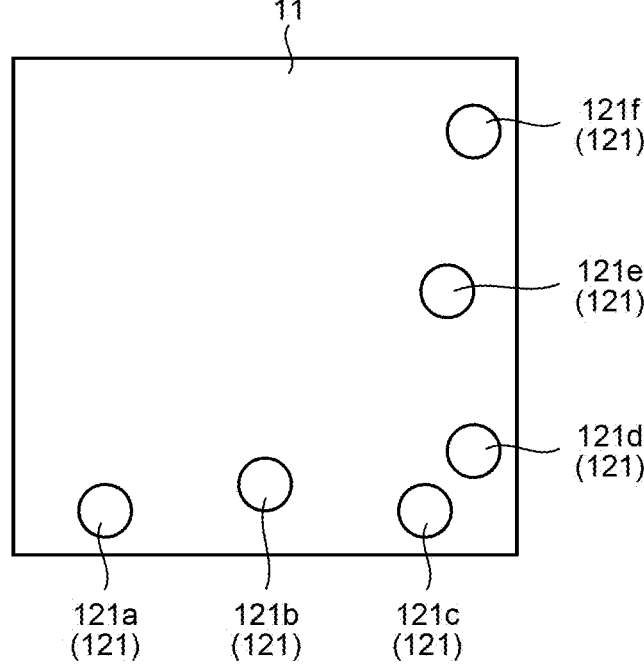
FIG. 15 is a schematic view of exemplary arrangement of holes each for insertion of a biasing member.

FIG. 15 is a schematic view of exemplary arrangement of holes each for insertion of a biasing member. The hole 121*a*, the hole 121*b*, and the hole 121*c* illustrated in FIG. 15 are disposed at positions identical to those of the hole 121*a*, the hole 121*b*, and the hole 121*c* illustrated in FIG. 12. The hole 121*d*, the hole 121*e*, and the hole 121*f* illustrated in FIG. 15 are disposed at the positions of the hole 121*a*, the hole 121*b*, and the hole 121*c* illustrated in FIG. 12 rotated counterclockwise by 90° around the central point of the high-temperature plate 11.

Function

As above, the thermoelectric modules 13 disposed between the high-temperature plate 11 and the low-temperature plate 12 are sealed by the sealing portion 21 the material of which has thermal resistance.

Effects

As described above, in the embodiment, the thermoelectric modules 13 disposed between the high-temperature plate 11 and the low-temperature plate 12 can be sealed by the sealing portion 21 having thermal resistance. According to the embodiment, the quality of sealing can be retained in long-term use in a high-temperature environment with condensation. According to the embodiment, electric power can be generated stably with inhibition of entry of moisture as a cause of trouble.

In the embodiment, the first positioning portion 31 is at least either recessed to or protruding from the upper face 11*a* of the high-temperature plate 11. The second positioning portion 32 is at least either recessed to or protruding from the lower face 12*b* of the low-temperature plate 12. In the embodiment, the connection between the lower portion of the sealing portion 21 and the first positioning portion 31 and the connection between the upper portion of the sealing portion 21 and the second positioning portion 32 each have a plurality of contact faces oriented in different directions, instead of having a single plane. Thus, in the embodiment, external water can be inhibited from entering by the sealing portion 21, the first positioning portion 31, and the second positioning portion 32.

In the embodiment, the first junction 51 seals a gap occurring between the lower portion of the sealing portion 21 and the first positioning portion 31 on the upper face 11*a* of the high-temperature plate 11 due to a variation in temperature. In the embodiment, the second junction 52 seals a gap occurring between the upper portion of the sealing portion 21 and the second positioning portion 32 on the lower face 12*b* of the low-temperature plate 12 due to a variation in temperature. According to the embodiment, the quality of sealing can be retained in long-term use in a high-temperature environment with condensation.

In the embodiment, the material of the sealing portion 21 is lower in thermal conductivity than those of the high-temperature plate 11 and the low-temperature plate 12. According to the embodiment, a leak of heat through the sealing portion 21 can be inhibited.

In the embodiment, the material of the sealing portion 21 is larger in thermal expansivity than those of the first positioning portion 31 and the second positioning portion 32. In the embodiment, the material of the sealing portion 21 is larger in thermal expansivity than those of the high-temperature plate 11 and the low-temperature plate 12. According to the embodiment, the sealing portion 21 deforms following a gap that occurs between the sealing portion 21 and the first positioning portion 31 or the second positioning portion 32 due to a variation in temperature, so that the quality of sealing can be retained. According to the embodiment, the quality of sealing can be retained in long-term use in a high-temperature environment with condensation.

In the embodiment, the high-temperature plate 11 and the low-temperature plate 12 are fixed by each biasing member 61 applying bias in a direction such that the space therebetween remains narrow. According to the embodiment, the high-temperature plate 11 and the low-temperature plate 12 can be properly fixed, regardless of a variation in temperature. According to the embodiment, even in a case where the high-temperature plate 11 or the low-temperature plate 12 deforms thermally due to a load in temperature or deforms due to creep, the deformation can be suppressed by the biasing force of each biasing member 61. According to the embodiment, the quality of sealing can be retained in long-term use in a high-temperature environment with condensation.

According to the embodiment, the plurality of biasing members 61 is disposed ununiformly in distance from the respective circumferential portions of the high-temperature plate 11 and the low-temperature plate 12. According to the embodiment, inhibited can be variations in the thickness of the thermoelectric power generation device 1.

According to the present disclosure, retained can be a quality of sealing resistant to long-term use in a high-temperature environment with condensation.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A thermoelectric power generation device comprising:

a first plate having a first face;

a second plate having a second face facing the first face;

a thermoelectric module disposed between the first face and the second face;

a seal disposed between the first face and the second face and configured to seal the thermoelectric module;

a first positioning portion that is recessed from the first face in a direction away from the second face and supports a lower portion of the seal; and a second positioning portion comprising:

a plurality of protruding portions that protrude from the second face toward the first face, and a recessed portion that is defined between the plurality of protruding portions and recessed in a direction away from the first face relative to the plurality of protruding portions, the recessed portion supporting an upper portion of the seal, wherein thermoelectric power generation device further comprises:

a first junction disposed between the lower portion of the seal and the first positioning portion, and a second junction disposed between the upper portion of the seal and the recessed portion of the second positioning portion, wherein each of the first junction and the second junction is made of an elastic material, and wherein each of the first junction and the second junction comprises a liquid gasket.

2. The thermoelectric power generation device according to claim 1, wherein the first plate and the second plate define a high-temperature plate and a low-temperature plate, respectively, and wherein the thermoelectric module is configured to generate electricity based on a temperature difference between the high-temperature plate and the low-temperature plate.

3. The thermoelectric power generation device according to claim 1, wherein the seal has (i) a first end covered by the first positioning portion and (ii) a second end covered by the second positioning portion, and wherein the first positioning portion is recessed into an inside of the first plate through the first face such that the first end of the seal extends through the first face and is accommodated at the inside of the first plate.

4. The thermoelectric power generation device according to claim 1, wherein a thermal conductivity of the seal is less than a thermal conductivity of each of the first plate and the second plate.

5. The thermoelectric power generation device according to claim 1, wherein a thermal expansivity of the seal is greater than a thermal expansivity of each of the first plate and the second plate.

6. The thermoelectric power generation device according to claim 1, wherein the first positioning portion is a part of the first plate, and the second positioning portion is a part of the second plate.

7. The thermoelectric power generation device according to claim 1, wherein the first junction covers side surfaces of the lower portion of the seal and protrudes to an outside of the first positioning portion toward the second face, and wherein the second junction covers side surfaces of the upper portion of the seal and protrudes to an outside the second positioning portion toward the first face.

8. The thermoelectric power generation device according to claim 1, wherein the first positioning portion covers side surfaces of the lower portion of the seal, and wherein the plurality of protruding portions cover side surfaces of the upper portion of the seal.

9. The thermoelectric power generation device according to claim 1, further comprising a biasing member that is disposed at a side of the first plate and the second plate, the biasing member being spaced apart from the seal and configured to apply force to at least one of the second plate or the first plate to thereby maintain a space between the first plate and the second plate.

10. A thermoelectric power generation device comprising:

a first plate having a first face;

a second plate having a second face facing the first face;

a thermoelectric module disposed between the first face and the second face;

a seal disposed between the first face and the second face and configured to seal the thermoelectric module;

a first positioning portion that is recessed from the first face in a direction away from the second face and supports a lower portion of the seal;

a second positioning portion that protrudes from the second face toward the first face and supports an upper portion of the seal;

a plurality of first biasing members that are arranged in a first direction along a first edge of the first plate; and a plurality of second biasing members that are arranged in a second direction along a second edge of the first plate, the second direction being orthogonal to the first direction, wherein the second positioning portion comprises:

a plurality of protruding portions that protrude from the second face toward the first face, and a recessed portion that is defined between the plurality of protruding portions and recessed in a direction away from the first face relative to the plurality of protruding portions, the recessed portion supporting the upper portion of the seal, wherein the thermoelectric power generation device further comprises:

a first junction disposed between the lower portion of the seal and the first positioning portion, and a second junction disposed between the upper portion of the seal and the recessed portion of the second positioning portion, and wherein each of the first junction and the second junction is made of an elastic material that is a liquid gasket.

11. The thermoelectric power generation device according to claim 10, wherein the first plate defines:

a plurality of first holes that are arranged along the first edge of the first plate and receive the plurality of first biasing members, respectively; and a plurality of second holes that are arranged along the second edge of the first plate and receive the plurality of second biasing members, respectively.

12. The thermoelectric power generation device according to claim 11, wherein at least one of the plurality of first holes is disposed inward in the second direction from the first edge relative to others of the plurality of first holes, and wherein at least one of the plurality of second holes is disposed inward in the first direction from the second edge relative to others of the plurality of second holes.

13. The thermoelectric power generation device according to claim 11, wherein the plurality of first holes and the plurality of second holes are symmetrically arranged with respect to a diagonal of the first plate.

14. The thermoelectric power generation device according to claim 13, wherein the plurality of first holes comprise (i) first corner holes spaced apart from each other in the first direction and (ii) a first middle hole disposed between the first corner holes, and wherein the first middle hole is disposed inward in the second direction from the first edge relative to the first corner holes.

15. The thermoelectric power generation device according to claim 14, wherein the plurality of second holes comprise (i) second corner holes spaced apart from each other in the second direction and (ii) a second middle hole disposed between the second corner holes, wherein the second middle hole is disposed inward in the first direction from the second edge relative to the second corner holes.

16. The thermoelectric power generation device according to claim 15, wherein one of the first corner holes and one of the second corner holes are disposed adjacent to each other at a corner of the first plate, and wherein a distance between the one of the first corner holes and the one of the second corner holes is less than a distance between the first middle hole and the one of the first corner holes and a distance between the second middle hole and the one of the second corner holes.

* * * * *